United States Patent
Xu

(10) Patent No.: US 9,658,501 B2
(45) Date of Patent: May 23, 2017

(54) FRINGE FIELD SWITCHING ARRAY SUBSTRATE AND PRODUCTION METHOD THEREOF AND DISPLAY APPARATUS

(71) Applicant: SHENZHEN CHINA STAR OPTOELECTRONICS TECHNOLOGY CO., LTD., Shenzhen, Guangdong (CN)

(72) Inventor: Xiangyang Xu, Shenzhen (CN)

(73) Assignee: SHENZHEN CHINA STAR OPTOELECTRONICS TECHNOLOGY CO. LTD., Shenzhen, Guangdong (CN)

( * ) Notice: Subject to any disclaimer, the term of this patent is extended or adjusted under 35 U.S.C. 154(b) by 0 days.

(21) Appl. No.: 14/896,406

(22) PCT Filed: Aug. 7, 2015

(86) PCT No.: PCT/CN2015/086334
§ 371 (c)(1),
(2) Date: Dec. 7, 2015

(87) PCT Pub. No.: WO2017/020322
PCT Pub. Date: Feb. 9, 2017

(65) Prior Publication Data
US 2017/0031198 A1 Feb. 2, 2017

(30) Foreign Application Priority Data
Jul. 31, 2015 (CN) .......................... 2015 1 0464845

(51) Int. Cl.
*G02F 1/1343* (2006.01)
*G02F 1/1333* (2006.01)
*H01L 27/12* (2006.01)
*G02F 1/1368* (2006.01)
*G02F 1/1362* (2006.01)

(52) U.S. Cl.
CPC ........ *G02F 1/13439* (2013.01); *G02F 1/1368* (2013.01); *G02F 1/133345* (2013.01); *G02F 1/134309* (2013.01); *G02F 1/136286* (2013.01); *H01L 27/124* (2013.01); *H01L 27/127* (2013.01); *H01L 27/1248* (2013.01); *G02F 2001/134372* (2013.01); *G02F 2001/136295* (2013.01); *G02F 2201/121* (2013.01); *G02F 2201/123* (2013.01)

(58) Field of Classification Search
CPC .... G02F 1/1343; G02F 1/1362; G02F 1/1368; G02F 1/133345; H01L 27/124
See application file for complete search history.

(56) References Cited

U.S. PATENT DOCUMENTS 5,844,647 A * 12/1998 Maruno ................. G02F 1/1368
349/110
8,400,589 B2 * 3/2013 Lee ................... G02F 1/136209
349/110

* cited by examiner

*Primary Examiner* — Mohammad Choudhry
(74) *Attorney, Agent, or Firm* — Soroker Agmon Nordman

(57) ABSTRACT

The present invention provides a method for producing a fringe field switching (FFS) array substrate, comprising: forming a gate electrode and a common electrode line on the array substrate; forming a gate electrode insulating layer; forming a layer of pixel electrode ITO; forming a semiconductor active layer; forming a source electrode and a drain electrode; forming an insulating protective layer and a via structure; forming a common electrode. The present invention further provides an FFS array substrate and a display apparatus, the display apparatus comprises the FFS array substrate above.

20 Claims, 5 Drawing Sheets

FRINGE FIELD SWITCHING ARRAY SUBSTRATE AND PRODUCTION METHOD THEREOF AND DISPLAY APPARATUS

BACKGROUND OF THE INVENTION

1. Field of the Invention

The present invention relates to the technical field of liquid crystal displays, and in particular to a fringe field switching array substrate (FFS) array substrate and a production method thereof, as well as a display apparatus.

2. Description of the Related Art

The technology of fringe field switching, FFS, which is an existing liquid crystal display technology, is a wide viewing angle technology developed to solve the application of big size, the high-definition desktop monitor and the LCD TV in the LCD field. An FFS LCD panel has advantages like short response time, high light transmission, a wide viewing angle, etc. However, due to the FFS LCD panel being produced by using two layers of indium tin oxide (Indium tin oxide, ITO), its production process needs one to two mask processes more than the normal LCD panel. In order to enhance the conductivity of the contact between the ITO and the metal, reduce the mask processes, the improved prior art directly produces the pixel ITO on the source electrode metal and the drain electrode metal, and thus the production process of a layer of the insulating protective layer is eliminated. However, because the semiconductor layer directly contacts the ITO etching solution, the active layer of the semiconductor layer is easily damaged by the ITO etching solution, and then the conducting feature of the active layer of the semiconductor is affected.

SUMMARY OF THE INVENTION

The present invention aims to provide a method for producing an FFS array substrate, the production method solves the problem in the prior art of the etching of the pixel electrode ITO damaging the semiconductor active layer without increasing the production process. The present invention further provides an FFS array substrate and a display apparatus.

The technical scheme of the present invention is as follows:

a method for producing a fringe field switching (FFS) array substrate, comprising steps of:

(1) forming a metal layer on the array substrate, and obtaining a gate electrode and a common electrode line by a patterning process;

(2) forming a gate electrode insulating layer on the gate electrode and the common electrode line, the gate electrode insulating layer entirely covering the array substrate;

(3) forming a layer of pixel electrode ITO on the gate electrode insulating layer between the gate electrode and the common electrode line;

(4) forming a semiconductor active layer on a location of the gate electrode insulating layer corresponding to the gate electrode, and a cross-sectional width of the semiconductor active layer less than the cross-sectional width of the gate electrode;

(5) forming a source electrode and a drain electrode on the semiconductor active layer and the gate electrode insulating layer, and the drain electrode overlapping and contacting a portion of the pixel electrode ITO and the drain electrode electrode being on the pixel electrode ITO;

(6) forming an insulating protective layer on the source electrode, the drain electrode, the semiconductor active layer, the pixel electrode ITO and the gate electrode insulating layer, and forming a via structure on the gate electrode insulating layer and the insulating protective layer on the common electrode line, and the cross-sectional width of the via structure less than the cross-sectional width of the common electrode line;

(7) forming a common electrode on the insulating protective layer and the via structure corresponding to the pixel electrode ITO.

Preferably, a thickness of the gate electrode and the common electrode line of step 1 is in a range from 3000 to 5000 am.

Preferably, the gate electrode and the common electrode line of step 1 are formed through precipitating metal Al or Cu by physical sputtering.

Preferably, the thickness of the gate electrode insulating layer of step 2 is in a range from 2000 to 5000 am.

Preferably, the gate electrode insulating layer of step 2 is formed through precipitating SiNx by plasma enhanced chemical vapor deposition.

Preferably, the thickness of the pixel electrode ITO of step 3 is in a range from 300 to 1000 am.

Preferably, the pixel electrode ITO of step 3 is formed by physical sputtering ITO material.

Preferably, the thickness of the semiconductor active layer of step 4 is in a range from 1300 to 2000 am.

Preferably, the semiconductor active layer of step 4 is formed through precipitating amorphous silicon or doped amorphous silicon material by plasma enhanced chemical vapor deposition.

Preferably, the thickness of the insulating protective layer is in a range from 2000 to 5000 am.

Preferably, the material for producing the insulating protective layer is SiNx.

Preferably, the thickness of the common electrode is in a range from 300 to 1000 am.

Preferably, the material for producing the common electrode is ITO.

An FFS array substrate, comprising:

a substrate;

a gate electrode line, formed on the substrate;

a gate electrode, formed on the substrate;

a common electrode line, formed on the substrate;

a gate electrode insulating layer, formed on the substrate, and covering the gate electrode line, the gate electrode, and the common electrode line;

a data line, formed on the gate electrode insulating layer;

a pixel electrode ITO, formed on the gate electrode insulating layer between the gate electrode and the common electrode line;

a semiconductor active layer, formed on a location of the gate electrode insulating layer corresponding to the gate electrode, and a cross-sectional width of the semiconductor active layer is less than the cross-sectional width of the gate electrode;

a source electrode and a drain electrode, both formed on the semiconductor active layer and the gate electrode insulating layer, the source electrode and the drain electrode respectively contacting two terminals of the semiconductor active layer and forming a TFT channel, the drain electrode overlapping and contacting a portion of the pixel electrode ITO and the drain electrode electrode being on the pixel electrode ITO;

an insulating protective layer, the insulating protective layer covering the pixel electrode ITO, the semiconductor active layer, the source electrode, the drain electrode, and the gate electrode insulating layer;

a via structure, formed on the gate electrode insulating layer and the insulating protective layer on the common electrode line, and the cross-sectional width of the via structure is less than the cross-sectional width of the common electrode line; and a common electrode, formed on the insulating protective layer and the via structure corresponding to the pixel electrode ITO.

Preferably, both a thickness of the gate electrode and a thickness of the common electrode line are in a range from 3000 to 5000 am, and the thickness of the gate electrode insulating layer is in a range from 2000 to 5000 am.

Preferably, the thickness of the pixel electrode ITO is in a range from 300 to 1000 am, and the thickness of the semiconductor active layer is in a range from 1300 to 2000 am.

Preferably, the thickness of the insulating protective layer is in a range from 2000 to 5000 am, and the thickness of the common electrode is in a range from 300 to 1000 am.

Preferably, the material for producing the gate electrode insulating layer and the insulating protective layer is SiNx, and the material for producing the semiconductor active layer is amorphous silicon or doped amorphous silicon.

Preferably, the material for producing the pixel electrode and the common electrode is ITO.

A display apparatus comprises the FFS array substrate above.

The beneficial effects of the present invention are as follows:

The present invention is a method for producing an FFS array substrate, the production process of the pixel electrode ITO is moved to an order prior to the order of the production process of the semiconductor active layer, the problem of the etching of the pixel electrode ITO damaging the semiconductor active layer of the prior art is solved without increasing the production process. In the FFS array substrate of the present invention, the pixel electrode ITO is under the drain electrode, so the structure is simpler.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
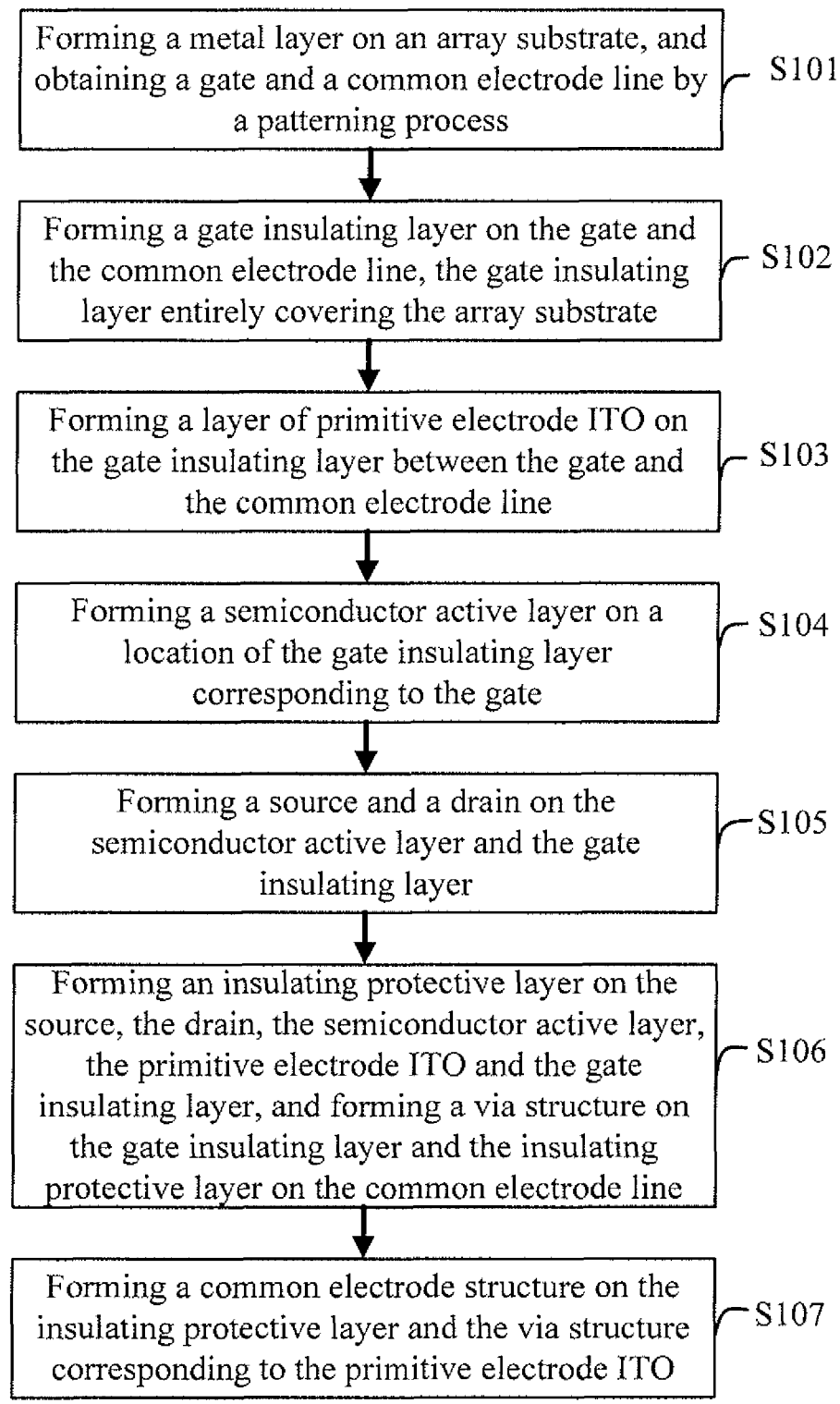
FIG. 1 illustrates a flowchart of the method for producing the FFS array substrate of the present invention.

As used in this specification the term "embodiment" means that instance, an example, or illustration. In addition, for the articles in this specification and the appended claims, "a" or "an" in general can be interpreted as "one or more" unless specified otherwise or clear from context to determine the singular form.

In the drawings, the same reference numerals denote units with similar structures.

Embodiment 1

Figure 2:
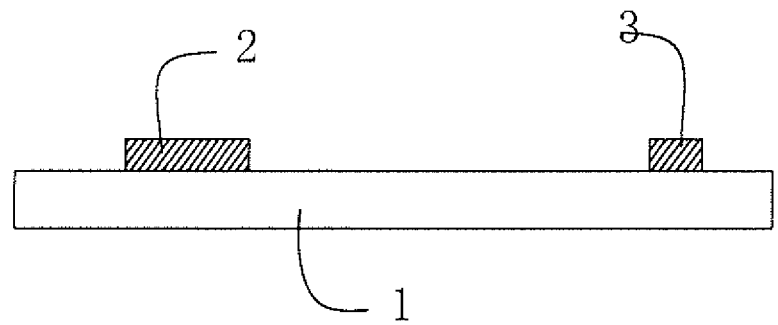
FIG. 2 illustrates a diagram of the structure of the gate electrode and the common electrode line formed on the substrate of the present invention.

FIG. 1 illustrates a flowchart of the method for producing the FFS array substrate of the present invention, FIG. 2-FIG. 7 are diagrams of the order of the production process of the FFS array substrate of the present invention, it can be seen from FIG. 1-FIG. 7, a method for producing an FFS array substrate of the present invention comprises the following steps:

Step S101: a layer of metal or metal alloy of Mo/Al/Cu with a thickness of 3000 to 5000 am is precipitated through physical sputtering on the substrate, and then the gate electrode 2 and the common electrode line 3 is formed through methods of coating, exposure, development, wet etching, and stripping, as shown in FIG. 2.

Step S102: the gate electrode insulating layer 4, which is SiNx with a thickness of 2000 to 5000 am, is precipitated on the gate electrode 2 and the common electrode line 3 through plasma enhanced chemical vapor deposition, the gate electrode insulating layer 4 entirely covers the substrate 1.

Figure 3:
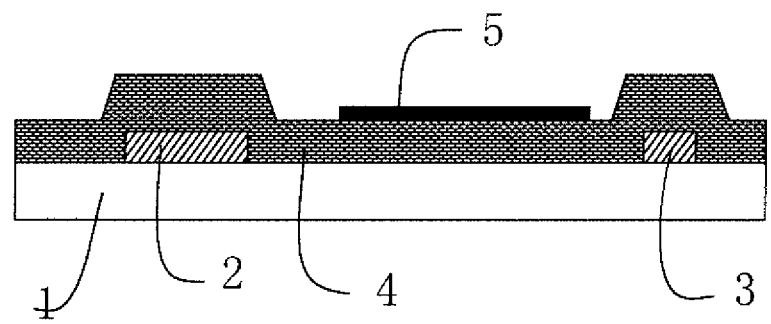
FIG. 3 illustrates a diagram of the structure of the gate electrode insulating layer and the pixel electrode ITO formed on the substrate of the present invention.

Step S103: then the structure of the pixel electrode 5, which is a layer of transparent conducting material like ITO with a thickness of 300 to 1000 am, is formed through precipitating by plasma enhanced chemical vapor deposition, as shown in FIG. 3.

Figure 8:
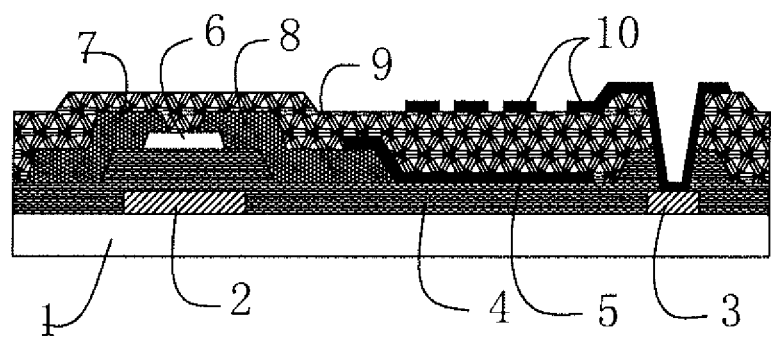
FIG. 8 illustrates a diagram of the structure of the FFS array substrate of the prior art.
Figure 9:
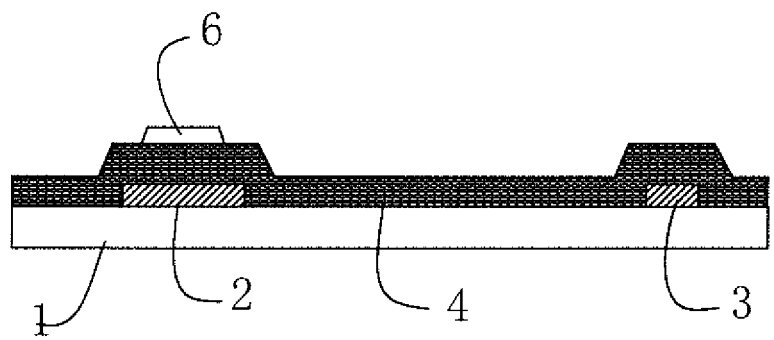
FIG. 9 illustrates a diagram of the structure of the semiconductor active layer formed on the FFS array substrate of the prior art.
Figure 10:
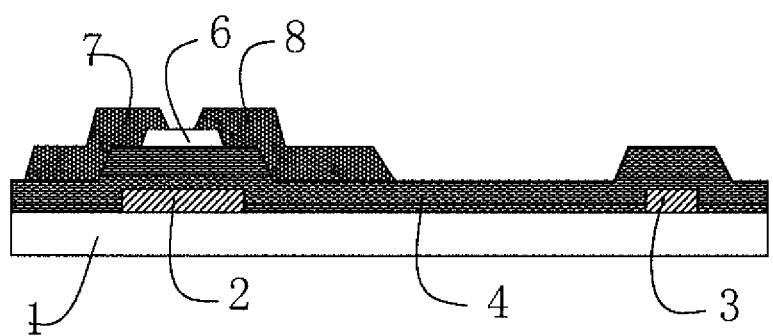
FIG. 10 illustrates a diagram of the structure of the source electrode and the drain electrode formed on the FFS array substrate of the prior art.
Figure 11:
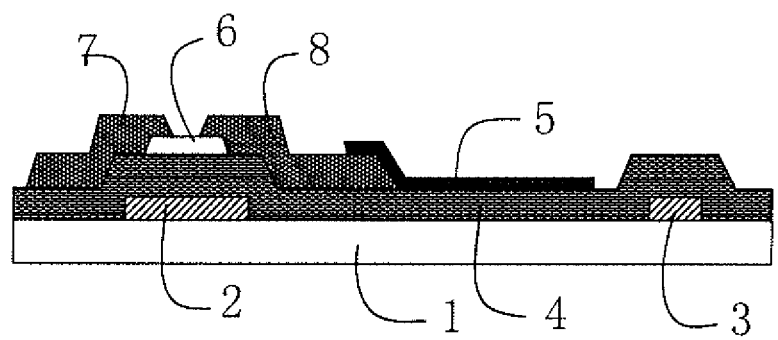
FIG. 11 illustrates a diagram of the structure of the pixel electrode ITO formed on the FFS array substrate of the prior art.

The step differs greatly from the prior art. FIG. 8 illustrates a diagram of the structure of the FFS array substrate of the prior art, and FIG. 9-FIG. 11 are part of the diagrams of the order of the production process of an FFS array substrate of the prior art. It can be seen from FIG. 9 that after the gate electrode insulating layer 4 is completed in the FFS array substrate of the prior art, the pixel electrode ITO 5 of the present invention is not formed directly on the gate electrode insulating layer 4 as in the present invention, but the semiconductor active layer 6 is formed on the gate electrode insulating layer 4 to which the gate electrode 2 corresponds, and then the source electrode 7 and the drain electrode 8 are formed, then the pixel electrode ITO 5 of the prior art is formed. This kind of production method of the prior art would result in the semiconductor active layer 6 being damaged by the etching solution of the pixel electrode ITO 5, because the semiconductor active layer 6 directly contacts the etching solution of the pixel electrode ITO 5, thus the conducting feature of the semiconductor active layer 6 is affected. However, the method of the step of the present invention is reversed, after the gate electrode insulating layer 4 is completed, the pixel electrode ITO 5 is directly formed on the gate electrode insulating layer 4, and then the semiconductor active layer 6, the source electrode 7, and the drain electrode 8 are formed. Thus, the semiconductor active layer 6 is protected from the damage of the etching solution of the pixel electrode ITO 5.

Figure 4:
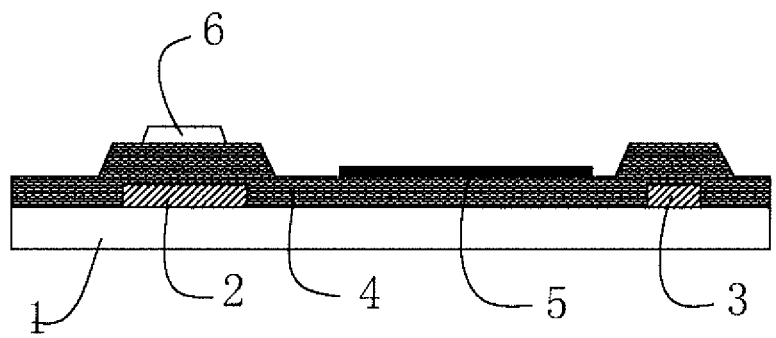
FIG. 4 illustrates a diagram of the structure of the semiconductor active layer formed on the substrate of the present invention.

Step S104: a layer of amorphous silicon and doped amorphous silicon with a thickness of 1300 to 2000 am is precipitated on the gate electrode insulating layer 4 on the gate electrode 2 by plasma enhanced chemical vapor deposition, then the semiconductor active layer 6 is formed through methods of coating, exposure, development, wet etching and stripping, and the cross-sectional width of the semiconductor active layer 6 is less than the cross-sectional width of the gate electrode 2, this is helpful for the TFT channel to be within the range of the gate electrode 2, as shown in FIG. 4.

Figure 5:
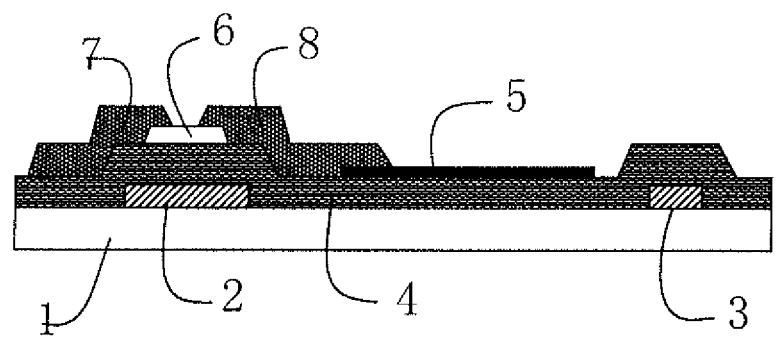
FIG. 5 illustrates a diagram of the structure of the source electrode and the drain electrode formed on the substrate of the present invention.

Step S105: a layer of metal or metal alloy of Mo/Al/Cu with a thickness of 3000 to 5000 am is precipitated through physical sputtering on the semiconductor active layer 6 and the gate electrode insulating layer 4, and then the metal structure of the source electrode 7 and the drain electrode 8 is formed through methods of coating, exposure, development, channel n+ etching and stripping, and the drain electrode 8 overlaps and contacts a portion of the pixel electrode ITO 5, and the drain electrode 8 is on the pixel electrode ITO 5, as shown in FIG. 5.

Figure 6:
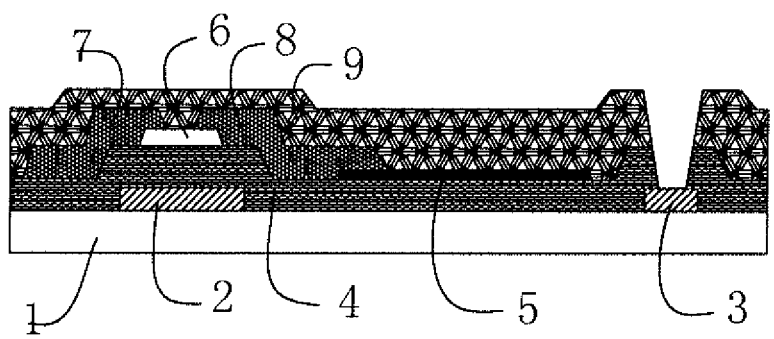
FIG. 6 illustrates a diagram of the structure of the insulating protective layer and the via structure formed on the substrate of the present invention.

Step S106: the insulating protective layer 9 which is material SiNx with a thickness of 2000 to 5000 am, is precipitated on the source electrode 7, the drain electrode 8, the semiconductor active layer 6, the pixel electrode ITO 5, and the gate electrode insulating layer 4 through plasma enhanced chemical vapor deposition, the via structure is formed on the gate electrode insulating layer 4 and the insulating protective layer 9 on the common electrode line 3 through methods of coating, exposure, development, dry etching, and stripping, and the cross-sectional width of the via structure is less than the cross-sectional width of the common electrode line 3; this is helpful for allowing the rear common electrode 10 and common electrode line 3 to contact, as shown in FIG. 6.

Figure 7:
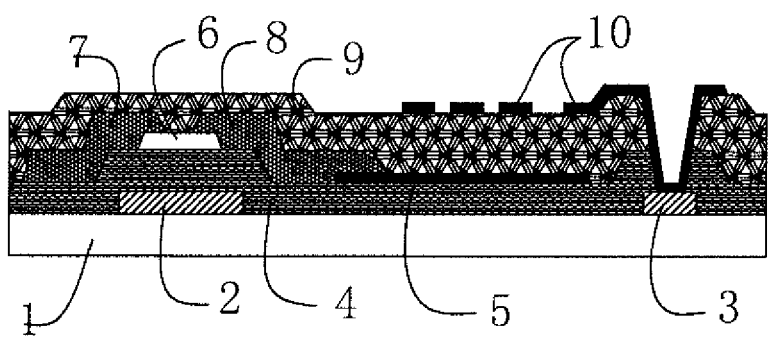
FIG. 7 illustrates a diagram of the complete structure of the common electrode already formed on the substrate of the present invention.

Step S107: a layer of transparent conducting material like ITO with thickness of 300 to 1000 am is precipitated by plasma enhanced chemical vapor deposition on the insulating protective layer 9 and the via structure to which the pixel electrode ITO 5 corresponds, and then the structure of the common electrode 10 is formed through methods of coating, exposure, development, wet etching, and stripping, as shown in FIG. 7.

Finally, every step of the method for producing the FFS array substrate of the present invention is completed.

Embodiment 2

As shown in FIG. 2-FIG. 7, an FFS array substrate of the present invention includes the substrate 1, the gate electrode line (not shown), the gate electrode 2, the common electrode line 3, the gate electrode insulating layer 4, the data line (not shown), the pixel electrode ITO 5, the semiconductor active layer 6, the source electrode 7, the drain electrode 8, the insulating protective layer 9 and the common electrode 10. The gate electrode line, the gate electrode 2, and the common electrode line 3 are formed on the substrate 1. The gate electrode insulating layer 4 is formed on the substrate 1, the gate electrode insulating layer 4 covers the gate electrode line, the gate electrode 2, and the common electrode line 3, the data line is formed on the gate electrode insulating layer 4.

The pixel electrode ITO 5 of the FFS array substrate of the present invention is formed on the gate electrode insulating layer 4 between the gate electrode 2 and the common electrode line 3, the semiconductor active layer 6 is formed on the gate electrode insulating layer 4 to which the gate electrode 2 corresponds, and the cross-sectional width of the semiconductor active layer 6 is less than the cross-sectional width of the gate electrode 2; this is helpful for the TFT channel to be within the range of the gate electrode 2, as shown in FIG. 4.

The source electrode 7 and the drain electrode 8 of the FFS array substrate of the present invention are both formed on the gate electrode insulating layer 4, the source electrode 7 and the drain electrode 8 respectively contacts the two terminals of the semiconductor active layer 6, forming the TFT channel, the drain electrode 8 overlaps and contacts a portion of the pixel electrode ITO 5, and the drain electrode 8 is on the pixel electrode ITO 5.

The FFS array substrate of the present invention covers a layer of the insulating protective layer 9 on the pixel electrode ITO 5, the semiconductor active layer 6, the source electrode 7, the drain electrode 8, and the gate electrode insulating layer 4, and the via structure is formed on the gate electrode insulating layer 4 and the insulating protective layer 9 on the common electrode line 3, the cross-sectional width of the via structure is less than the cross-sectional width of the common electrode line 3; this is helpful for the rear common electrode 10 and common electrode line 3 to contact, as shown in FIG. 6. The common electrode ITO is formed on the insulating protective layer and the via structure to which the pixel electrode corresponds.

Additionally, according to the preferred embodiment, the thickness of the gate electrode 2 and the common electrode line 3 is in a range from 3000 to 5000 am, the thickness of the gate electrode insulating layer 4 is in a range from 2000 to 5000 am, the thickness of the pixel electrode ITO 5 is in a range from 300 to 1000 am, the thickness of the semiconductor active layer 6 is in a range from 1300 to 2000 am, the thickness of the insulating protective layer 9 is in a range from 2000 to 5000 am, the thickness of the common electrode 10 is in a range from 300 to 1000 am, the material for producing the gate electrode insulating layer 4 and the insulating protective layer 9 is SiNx, and the material for producing the semiconductor active layer 6 is amorphous silicon or doped amorphous silicon, the material for producing the pixel electrode ITO 5 and the common electrode 10 is ITO.

Embodiment 3

A display apparatus, comprising the FFS array substrate mentioned in embodiments 1 and 2 above.

In summary, although the present invention has been described in preferred embodiment above, the preferred embodiments described above are not intended to limit the invention. Persons skilled in the art, without departing from the spirit and scope of the invention otherwise, may be used for a variety modifications and variations, so the scope of the invention as defined by the claims prevails.

What is claimed is:
1. A method for producing a fringe field switching (FFS) array substrate, comprising steps of:

(1) forming a metal layer on an array substrate, and obtaining a gate electrode and a common electrode line by a patterning process;

(2) forming a gate electrode insulating layer on the gate electrode and the common electrode line, the gate electrode insulating layer entirely covering the array substrate;

(3) forming a layer of pixel electrode ITO on the gate electrode insulating layer between the gate electrode and the common electrode line;

(4) forming a semiconductor active layer on a location of the gate electrode insulating layer corresponding to the gate electrode, and a cross-sectional width of the semiconductor active layer being less than a cross-sectional width of the gate electrode;

(5) forming a source electrode and a drain electrode on the semiconductor active layer and the gate electrode insulating layer, and the drain electrode overlapping and contacting a portion of the pixel electrode ITO and the drain electrode being on the pixel electrode ITO;

(6) forming an insulating protective layer on the source electrode, the drain electrode, the semiconductor active layer, the pixel electrode ITO and the gate electrode insulating layer, and forming a via structure on the gate electrode insulating layer and the insulating protective layer on the common electrode line, and a cross-sectional width of the via structure being less than a cross-sectional width of the common electrode line;

(7) forming a common electrode on the insulating protective layer and the via structure corresponding to the pixel electrode ITO.

2. The method for producing the FFS array substrate according to claim 1, wherein both a thickness of the gate electrode and a thickness of the common electrode line of step 1 are in a range from 3000 to 5000 am.

3. The method for producing the FFS array substrate according to claim 1, wherein the gate electrode and the common electrode line of step 1 are formed through precipitating Al or Cu by physical sputtering.

4. The method for producing the FFS array substrate according to claim 1, wherein a thickness of the gate electrode insulating layer of step 2 is in a range from 2000 to 5000 am.

5. The method for producing the FFS array substrate according to claim 1, wherein the gate electrode insulating layer of step 2 is formed through precipitating SiNx by plasma enhanced chemical vapor deposition.

6. The method for producing the FFS array substrate according to claim 1, wherein a thickness of the pixel electrode ITO of step 3 is in a range from 300 to 1000 am.

7. The method for producing the FFS array substrate according to claim 1, wherein the pixel electrode ITO of step 3 is formed by physical sputtering ITO material.

8. The method for producing the FFS array substrate according to claim 1, wherein a thickness of the semiconductor active layer of step 4 is in a range from 1300 to 2000 am.

9. The method for producing the FFS array substrate according to claim 1, wherein the semiconductor active layer of step 4 is formed through precipitating amorphous silicon or doped amorphous silicon material by plasma enhanced chemical vapor deposition.

10. The method for producing the FFS array substrate according to claim 1, wherein the thickness of the insulating protective layer is in a range from 2000 to 5000 am.

11. The method for producing the FFS array substrate according to claim 1, wherein the material for producing the insulating protective layer is SiNx.

12. The method for producing the FFS array substrate according to claim 1, wherein the thickness of the common electrode is in a range from 300 to 1000 am.

13. The method for producing the FFS array substrate according to claim 1, wherein the material for producing the common electrode is ITO.

14. An FFS array substrate, comprising:
a substrate;
a gate electrode line, formed on the substrate;
a gate electrode, formed on the substrate;
a common electrode line, formed on the substrate;
a gate insulating layer, formed on the substrate, and covering the gate electrode line, the gate electrode and the common electrode line;
a data line, formed on the gate electrode insulating layer;
a pixel electrode ITO, formed on the gate electrode insulating layer between the gate electrode and the common electrode line;
a semiconductor active layer, formed on a location of the gate electrode insulating layer corresponding to the gate electrode, and a cross-sectional width of the semiconductor active layer being less than the cross-sectional width of the gate electrode;
a source electrode and a drain electrode, both formed on the semiconductor active layer and the gate electrode insulating layer, the source electrode and the drain electrode respectively contacting two terminals of the semiconductor active layer, forming a TFT channel the drain electrode overlapping and contacting a portion of the pixel electrode ITO and the drain electrode being on the pixel electrode ITO;
an insulating protective layer, the insulating protective layer covering the pixel electrode ITO, the semiconductor active layer, the source electrode, the drain electrode and the gate electrode insulating layer;
a via structure, formed on the gate electrode insulating layer and the insulating protective layer on the common electrode line, and the cross-sectional width of the via structure being less than the cross-sectional width of the common electrode line; and
a common electrode, formed on the insulating protective layer and the via structure corresponding to the pixel electrode ITO.

15. The FFS array substrate according to claim 14, wherein both a thickness of the gate electrode and a thickness of the common electrode line are in a range from 3000 to 5000 am, the thickness of the gate electrode insulating layer is in a range from 2000 to 5000 am.

16. The FFS array substrate according to claim 14, wherein the thickness of the pixel electrode ITO is in a range from 300 to 1000 am, the thickness of the semiconductor active layer is in a range from 1300 to 2000 am.

17. The FFS array substrate according to claim 14, wherein the thickness of the insulating protective layer is in a range from 2000 to 5000 am, the thickness of the common electrode is in a range from 300 to 1000 am.

18. The FFS array substrate according to claim 14, wherein the material for producing the gate electrode insulating layer and the insulating protective layer is SiNx, the material for producing the semiconductor active layer is amorphous silicon or doped amorphous silicon.

19. The FFS array substrate according to claim 14, wherein the material for producing the pixel electrode and the common electrode is ITO.

20. A display device, comprising the FFS array substrate according to claim 14.

\* \* \* \* \*